United States Patent [19]

Loreck et al.

[11] Patent Number: 5,451,867
[45] Date of Patent: Sep. 19, 1995

[54] METHOD AND CIRCUIT CONFIGURATION FOR CONDITIONING THE OUTPUT SIGNAL OF A ROTATIONAL SPEED SENSOR

[75] Inventors: Heinz Loreck, Idstein; Michael Zydek, Frankfurt am Main; Wolfgang Fey, Wörrstadt, all of Germany

[73] Assignee: Alfred Teves GmbH, Frankfurt, Germany

[21] Appl. No.: 81,638

[22] Filed: Jun. 24, 1993

[63] Continuation of PCT/EP91/01843, Sep. 26, 1991.

[30] Foreign Application Priority Data

Oct. 24, 1990 [DE] Germany .......... 40 33 740.5

[51] Int. Cl.⁶ .......... G01P 3/481; G01P 3/46; G01P 3/48; H03K 5/08
[52] U.S. Cl. .......... 324/166; 324/163; 364/565
[58] Field of Search .......... 324/160, 163, 166, 173, 324/174; 340/441, 670, 671; 364/565; 188/181 R; 361/239, 240

[56] References Cited

U.S. PATENT DOCUMENTS

| | | | |
|---|---|---|---|
| 4,575,677 | 11/1986 | Dennis . | |
| 4,837,508 | 6/1989 | Garnault | 324/166 |
| 4,894,613 | 1/1990 | Tsugawa | 324/166 X |
| 5,012,207 | 4/1991 | Edwards | 324/166 |
| 5,101,155 | 3/1992 | Oehler et al. | 324/166 |
| 5,274,326 | 12/1993 | Bleckmann et al. | 324/166 |

FOREIGN PATENT DOCUMENTS

| | | |
|---|---|---|
| 2235056 | 8/1973 | Germany . |
| 2739173 | 3/1979 | Germany . |
| 2827348 | 1/1980 | Germany . |
| 3115237 | 11/1982 | Germany . |
| 3226073 | 4/1983 | Germany . |
| 3714271 | 11/1988 | Germany . |
| 3837821 | 5/1990 | Germany . |
| 3936831 | 5/1991 | Germany . |
| 668871 | 1/1989 | Switzerland . |
| 84/00452 | 2/1984 | WIPO . |
| 88/04053 | 6/1988 | WIPO . |

*Primary Examiner*—Gerard R. Strecker
*Attorney, Agent, or Firm*—Ratner & Prestia

[57] ABSTRACT

A circuit configuration which serves to condition the output signal of a rotational speed sensor, e.g., the wheel sensor of an automotive vehicle. The circuit configuration includes a trigger circuit, the "hysteresis" or trigger thresholds thereof being controllable, and includes circuits for determining a coupling factor which, multiplied by the frequency of the sensor signal corresponding to the speed of rotation, forms the amplitude of the sensor output signal. To determine the coupling factor, and to adjust the hysteresis, threshold values are predefined for the output signal of the rotational speed sensor. Upon start of the vehicle, the coupling factor is determined from the frequency of the sensor signal at the point of time the threshold values are reached, and the hysteresis is adjusted accordingly.

12 Claims, 2 Drawing Sheets

METHOD AND CIRCUIT CONFIGURATION FOR CONDITIONING THE OUTPUT SIGNAL OF A ROTATIONAL SPEED SENSOR

This application is a continuation of International Application No. PCT/EP91/01843 filed on 26 Sep. 1991.

BACKGROUND OF THE INVENTION

1. Field of the Invention

The present invention relates to a method of conditioning the output signal of a rotational speed sensor (e.g. the wheel sensor of an automotive vehicle), the frequency of which is analyzed for determining the wheel speed, the amplitude thereof, however, being equally responsive to the wheel speed, by way of a trigger circuit, the "hysteresis" or trigger thresholds of which are controllable, by way of circuits for determining a coupling factor which, multiplied by the frequency of the sensor signal corresponding to the rotational speed, forms the amplitude of the sensor output signal, as well as by way of circuits for adjusting the "hysteresis" of the trigger circuit in response to the coupling factor. A circuit configuration for implementing this method is likewise comprised by the present invention.

2. Description of the Prior Art

As is known, the rotational speed of a wheel or a shaft can be determined by means of a toothed disc which co-rotates with the wheel or the shaft, and by means of a stationary inductive transducer. The rotating toothed disc induces in the coil of the transducer an a.c. voltage, the frequency of which is responsive to the number of teeth and the rotary motion, and which therefore can be tapped and analyzed for determining the rotary motion. However, not only the frequency but also the amplitude of the output signal which the transducer or wheel sensor, respectively, issues are dependent on the rotary motion. On slow rotary motions the amplitude is so low that it causes difficulties to separate the useful signal from the inevitable disturbances. As the signal amplitude is highly dependent on the air gap between the toothed disc and the transducer and manufacturing tolerances also are a factor which must be considered, the amplitude of the sensor output signal can adopt very different values while the rotary motion stays the same. Therefore, it has been imperative so far to prescribe very close manufacturing tolerances, to readjust the air gap after the assembly and during maintenance of the vehicle and to compensate for the effects of the great dependency of the signal amplitude on the rotational speed by correspondingly devising the sensor-signal conditioning circuitry.

It has been proposed in the prior patent application DE 39 36 831-A1 to adjust the "hysteresis" or, respectively, the threshold values of the trigger circuit which is supplied with the sensor output signal in response to the actual coupling factor. To this end, this circuit configuration for conditioning the sensor output signal is equipped with circuits which determine the coupling factor based on the signal frequency which is proportional to the rotational speed and based on the signal voltage. These circuits, after an "analysis" of the measured factor in consideration of the vehicle speed influence the hysteresis of the trigger circuit. The measurement of the coupling factor at higher speed is deemed to be "more reliable", so the influence of the measurement on the trigger circuit hysteresis adjustment is rated to be greater at high wheel speed than at low wheel speed.

SUMMARY OF THE INVENTION

It is the object of the present invention to provide a particularly simple and reliable circuit configuration and method of adjusting the hysteresis of the trigger circuit.

To achieve this object, the method of the type previously referred to is devised such that, for determining the coupling factor and for adjusting the hysteresis, predetermined amplitude threshold values for the output signal of the rotational speed sensor are provided. The threshold values define positive or negative deviations of the amplitude of the rotational speed sensor output signal ($U_S$) from a zero point (or working point) preset by preload. On start-up of the vehicle, the coupling factor is determined from the frequency of the sensor signal representative of the wheel speed at the point in time when both threshold values are reached or exceeded within a period for the first time.

That is to say, according to the present invention, amplitude threshold values (a positive and a negative threshold value), are set for the output signal of the rotational speed sensor, and the "hysteresis" of the trigger circuit is adjusted as soon as the output signal of the sensor reaches these amplitude thresholds on start of the vehicle. Since the alternating signal at the output of the rotational speed sensor may be distorted, (e.g. due to variation of the air gap as a result of eccentricity or due to an interference), the adjustment of the "hysteresis" is performed only when both the positive and the negative threshold value are reached and/or exceeded during a period of time.

A circuit configuration for implementing the method according to this invention comprises a circuit for generating a signal at the point in time when both amplitude threshold values are reached or exceeded within a period for the first time, and comprises an arithmetic unit or a microprocessor which is provided to calculate the coupling factor from the wheel speed at the point in time the amplitude threshold values are reached and to issue a signal for the adjustment of the hysteresis in dependence on the coupling factor.

According to a favorable aspect of the present invention, the circuit configuration can be devised such that the adjustment of the hysteresis is repeated on every start of the vehicle. On the other hand, however, it may also be expedient and sufficient to initiate the hysteresis adjustment by regularly recurring actions, (e.g. whenever the engine of the automotive vehicle is switched on) and by subsequent start of the vehicle.

Further details of this invention can be taken from the circuit configuration described below and from the drawings illustrating the mode of operation.

DETAILED DESCRIPTION OF THE INVENTION

Figure 1:
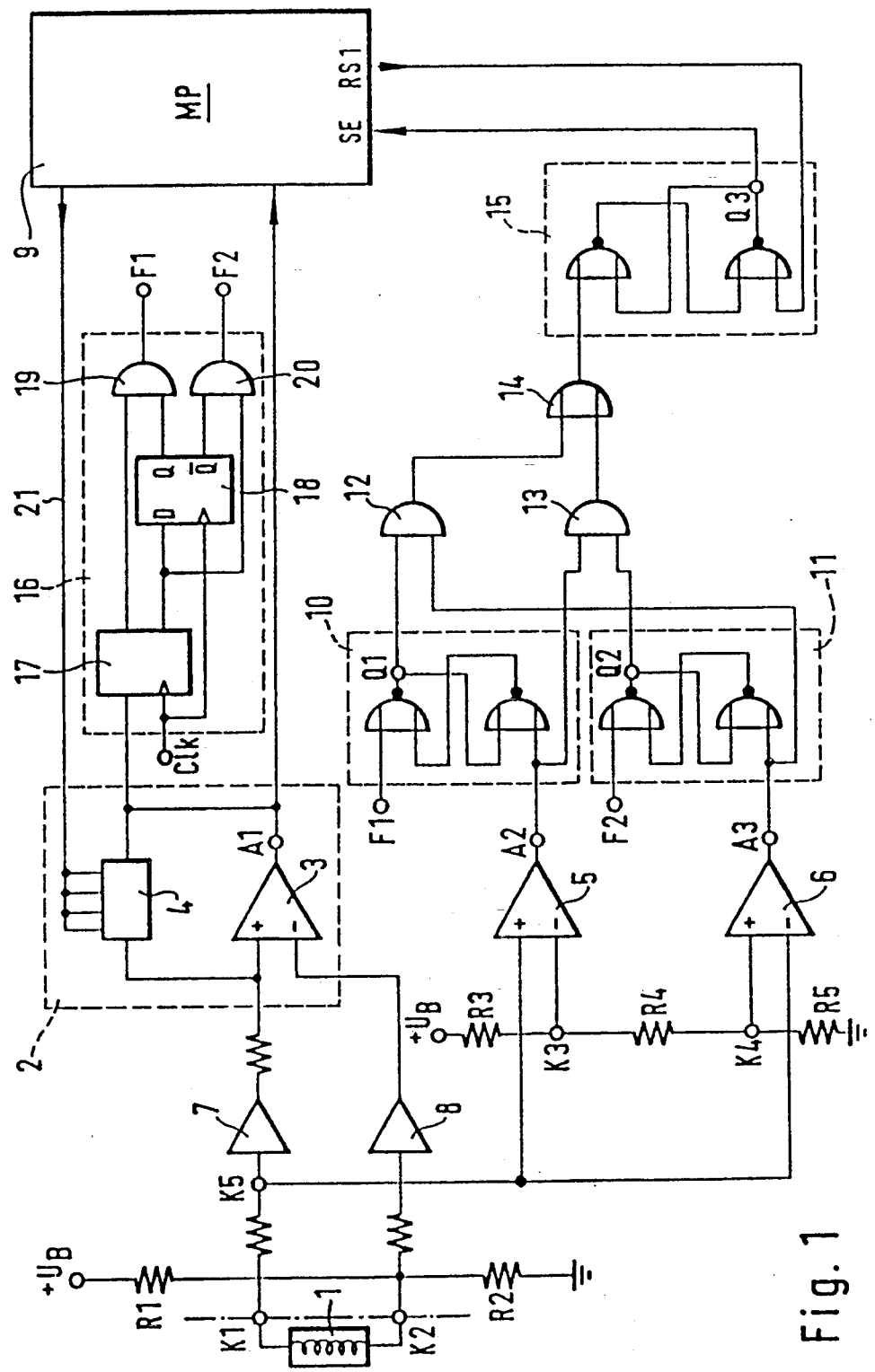
FIG. 1 shows an embodiment of a circuit configuration according to the invention.

The circuit configuration shown in FIG. 1 serves to condition the output signal of a wheel sensor 1. Such wheel sensors are installed, for instance, in automotive vehicles and are component parts of an anti-lock system, of a traction slip control system, or they supply information to an electronic suspension control system.

The output signal of the sensor 1 is delivered to a trigger circuit 2 which comprises a comparator 3 with a controllable coupling circuit 4. By means of the coupling circuit 4, the trigger thresholds and the hysteresis of the trigger circuit 2 are adjusted.

The working point or zero point of the sensor 1 is determined, in the present case, by a voltage divider R1, R2 to which a stabilized d.c. voltage +UB is applied. In practice, the output signal of the wheel sensor 1 which can be tapped by the terminals K1, K2 is a sine voltage oscillating roughly symmetrically about this zero point. Another voltage divider R3, R4, R5, which is also connected to the voltage source +UB, defines a positive and a negative threshold value $U_{S1}$, $U_{S2}$—see FIG. 2—, the exceeding or, respectively, falling short of is detected and signalled by means of comparators 5, 6. In the exemplary embodiment, the potential at the terminal K2 amounts to +2.5 volt, and the threshold values $U_{S1}$ and $U_{S2}$, respectively, at terminal K3 are at +3.5 volt, at K4 +1.5 volt. Consequently, the amplitude of the output signal of the wheel sensor has to reach +1 volt and −1 volt relative to the working point in order to cause an output signal from the comparators 5, 6 or, respectively, a change in the output signal.

Reference numerals 7 and 8 designate separator stages or impedance buffers which are interposed in order to avoid reactions by the hysteresis adjustment on the output of the sensor 1.

A number of flip-flops and gates are arranged between the outputs A2 and A3 of the comparators 5 and 6, respectively, and a microprocessor 9, through which "threshold identification" (SE) is signalled to the microprocessor 9 as soon as the positive and the negative threshold value to which the comparators 5, 6 are adjusted are reached or exceeded during one period of the sensor output signal ($U_S$).

The outputs A2 and A3 of the comparators 5 and 6, respectively, each lead to a flip-flop 10 and 11, respectively. Flip-flops 10 and 11 are set "AND"/"OR" at the outputs Q1 and Q2, respectively. A signal issues in the presence of an input signal F1 and F2, respectively, and, when on start of the vehicle and, respectively, on rise of the output voltage $U_S$ of the wheel sensor 1, the corresponding positive or negative threshold value $U_{S1}$, $U_{S2}$ is reached or exceeded. It is ensured via AND-gates 12 or 13 or via an OR-gate 14 that a signal is delivered further only if the positive and the negative threshold value were reached or exceeded during a period of the sensor output signal ($U_S$). The threshold identification SE is signalled via an output Q3 of another flip-flop 15 which can be reset via the output RS1 of the microprocessor 9.

Figure 2:
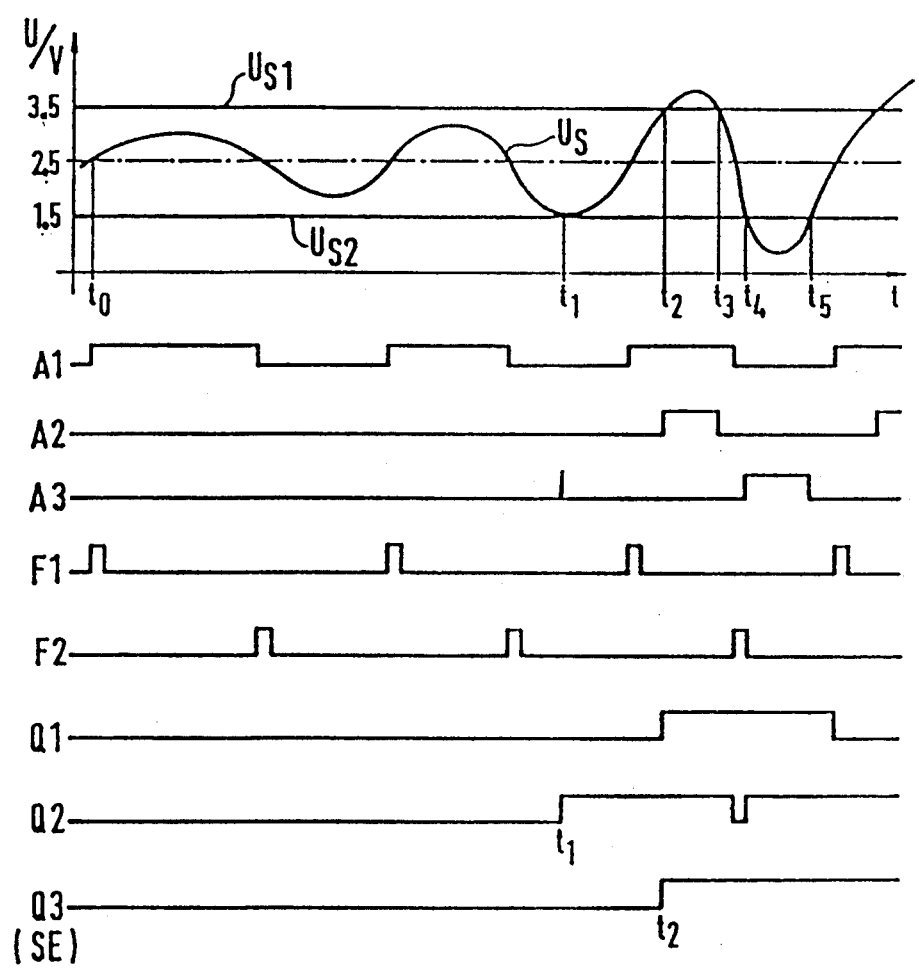
FIG. 2 shows in diagrams the signals at the indicated measuring points of the circuit configuration according to FIG. 1.

The actuating signals F1, F2 of the flip-flops 10, 11 are produced by means of a circuit 16 which is substantially composed of two edge-triggered flip-flops 17, 18 and two AND-gates 19, 20. As is illustrated in FIG. 2, the signal F1 is caused on every zero passage and positive flank of the wheel sensor output signal $U_S$, while signal F2 is caused on every zero passage and negative flank of the output signal $U_S$. These two signals F1, F2 cause the resetting of the flip-flops 10, 11 so that the flip-flop 15 will be set only if the negative and the positive threshold value are reached or exceeded within a period of the sensor output signal ($U_S$). Consequently, a signal appears on the output Q1 of the flip-flop 10 as soon as the positive threshold value $U_{S1}$ is reached or exceeded. The flip-flop 10 is reset again by means of the signal F1. The same mode of function applies to the flip-flop 11 which is set on reaching or exceeding the threshold $U_{S2}$ and is reset by the signal F2. Thus, a signal appears at the output Q3 of the flip-flop 15 as soon as the positive threshold value $U_{S1}$ is reached or exceeded, under the condition that the negative threshold value $U_{S2}$ has been reached immediately before. The positive switch threshold $U_{S1}$ is exceeded after the directly preceding attainment of the negative switch threshold $U_{S2}$ takes place at the point of time $t_2$ according to FIG. 2.

The negative switch threshold $U_{S2}$ is reached at the point of time $t_1$ according to FIG. 2. However, as the sensor output voltage $U_S$ is previously below the (positive) threshold value $U_{S1}$, the attainment of the threshold value $U_{S2}$ does not yet result in flipping of the flip-flop 15 and, respectively, occurrence of an output signal Q3 which is identical to the signal "threshold identification" (SE) at the microprocessor 9.

Moreover, FIG. 2 shows the signals at the outputs A1, A2, A3 of the comparators 3, 5, 6, the resetting signals F1 and F2 produced by the circuit 16 and the flip-flop output signals Q1, Q2, Q3 (SE) for a starting operation of a vehicle. The voltage variation $U_S$ at the output of the wheel sensor 1 and, respectively, at the terminal K5 to which these signals apply is also shown in FIG. 2. The same time slot pattern applies to the voltage variation $U_S$ and to the signals at the points mentioned in FIG. 2.

The resetting of the flip-flop 15 by the resetting signal RS1 generated by the microprocessor 9 takes place—depending on the embodiment of this invention—prior to every start of the vehicle or at regularly recurring events, (e.g. whenever the vehicle is started).

The switch hysteresis was disregarded in the illustration of the output signal A1 of the comparator 3 according to FIG. 2. Expediently, a basic hysteresis of, for example, 100 millivolts, is predetermined and/or adjusted by the microprocessor 9 during the starting operation. After the coupling factor has been computed by the microprocessor 9 from the switching thresholds and, respectively, the attainment of the switching thresholds and the vehicle speed or wheel speed reached at the time the thresholds are reached, the "hysteresis" is adjusted to the appropriate value by means of the circuit 4 to which line 21 leads. In the exemplary embodiment of the present invention, the comparator 3 and the circuit 4 are designed in the form of a structural element with a digitally adjustable hysteresis. The four lines at the input of the feedback circuit 4 according to FIG. 1 symbolize that the feedback signal is transmitted by a four-digit binary number. Thus, the hysteresis can be adjusted to a maximum of 16 different values in this case.

The mode of operation of the inventive circuit configuration can be determined from the preceding description. At first, the "hysteresis" is adjusted to a very low basic value (e.g., 100 millivolts). After reaching or exceeding the positive and the negative threshold values during a starting operation—both threshold values must be reached in direct succession—the microprocessor computes the actual coupling factor and adjusts the "hysteresis" to the appropriate value in response to the result of this computation. At specific points of time, the threshold identification signal is cancelled again by the microprocessor via the output RS1, and a new computation of the hysteresis and, respectively, of the trigger thresholds is performed.

We claim:

1. A circuit configuration for conditioning the output signal of a rotational speed sensor of an automotive vehicle, the frequency of which is analyzed for determining the wheel speed, the amplitude thereof being equally responsive to the wheel speed, by way of a trigger circuit, the hysteresis of which is controllable, said circuit configuration including:
   (1) first circuits for determining a coupling factor which, multiplied by the frequency of the sensor signal corresponding to the rotational speed, forms the amplitude of the sensor output signal, and
   (2) second circuits for adjusting the hysteresis of the trigger circuit in response to the coupling factor, characterized in that the circuits for determining the coupling factor comprise:
   means for furnishing the first circuits with predetermined amplitude threshold values for the output signal of the rotational speed sensor, which amplitude threshold values define positive or negative deviations of the amplitude of the rotational speed sensor output signal from a predetermined zero point or working point; and
   means for determining the coupling factor on start-up of the vehicle from the frequency of the sensor signal representative of the wheel speed at the point of time when both positive and negative threshold values are reached or exceeded within a period of time not greater than said sensor output signal period of the sensor output signal for the first time.

2. A circuit configuration as claimed in claim 1, characterized in that the determining means comprises:
   (a) a circuit for generating a signal at the point of time when both amplitude threshold values are reached or exceeded within a period for the first time, and
   (b) an arithmetic unit or a microprocessor which is provided to calculate the coupling factor from the wheel speed at the point of time the amplitude threshold values are reached and to issue a signal for the adjustment of the hysteresis in dependence on the coupling factor.

3. A circuit configuration as claimed in claim 2, characterized in that the adjustment of the hysteresis is repeated on every start of the vehicle.

4. A circuit configuration as claimed in claim 2, characterized in that the hysteresis adjustment is repeated whenever the engine of the automotive vehicle is switched on and by subsequent start of the vehicle.

5. A circuit configuration for conditioning an output signal from a wheel rotational speed sensor in an automotive vehicle, said sensor output signal having a period, a frequency and an amplitude that are dependent upon wheel rotational speed, said circuit configuration comprising:
   a trigger circuit responsive to said sensor output signal, said trigger circuit including:
      (a) means responsive to said sensor output signal for generating a trigger output signal,
      (b) means for receiving said trigger output signal and providing a positive feedback signal with a feedback signal magnitude to said generating means, said feedback signal magnitude having an initial value, and
      (c) means for adjusting said feedback signal magnitude from said initial value to a further value;
   means for providing a stabilized voltage zero point to said trigger circuit;
   means for providing positive and negative threshold values, said positive and negative threshold values being respective positive and negative sensor output signal deviations relative to said stabilized voltage zero point;
   means responsive to said sensor output signal and said positive and negative threshold providing means for generating a threshold identification signal when said sensor output signal falls below said negative threshold and exceeds said positive threshold within a time interval not greater than said sensor output signal period for the first time; and
   means responsive to said trigger output signal and said threshold identification signal for generating and providing to said adjusting means an adjustment initiating signal that causes said adjusting means to adjust said feedback signal magnitude, said further value being determined by the value of the sensor output signal frequency corresponding to the wheel speed when said threshold identification signal is generated.

6. A circuit configuration in accordance with claim 5, wherein said threshold identification signal generating means only generates said threshold identification signal when said sensor output signal falls below said negative threshold and thereafter exceeds said positive threshold within a time interval not greater than said sensor output signal period for the first time.

7. A circuit configuration in accordance with claim 5:
   (a) wherein said adjustment signal generating means is an arithmetic unit, and
   (b) said trigger output signal is an alternating signal whose frequency is dependent on wheel speed.

8. A circuit configuration in accordance with claim 5:
   (a) wherein said adjustment signal generating means is a microprocessor, and
   (b) said trigger output signal is an alternating signal whose frequency is dependent on wheel speed.

9. A circuit configuration in accordance with claim 5:
   (a) wherein said positive feedback signal is returned to said initial value, and
   (b) said feedback signal magnitude adjustment is repeated each time said vehicle starts to move.

10. A circuit configuration in accordance with claim 5:
    (a) wherein said positive feedback signal is returned to said initial value, and
    (b) said feedback signal magnitude adjustment is repeated each time said vehicle is switched on and each time said vehicle starts to move.

11. A method for conditioning an output signal from a wheel rotational speed sensor in an automotive vehicle, the sensor output signal having a period, a frequency and an amplitude that are dependent upon wheel rotational speed, the amplitude of the output signal being determined by the product of the frequency of the sensor multiplied by a coupling factor, the method comprising the steps of:
    (a) defining positive and negative thresholds, the positive and negative thresholds being respective positive and negative sensor output signal deviations relative to a stabilized voltage zero point;
    (b) generating a trigger output signal in response to the sensor output signal;

(c) forming from the trigger output signal a positive feedback signal and adding the positive feedback signal to the sensor output signal, the positive feedback signal having a feedback signal magnitude and an initial magnitude value;

(d) generating a threshold identification signal when the sensor output signal falls below the negative threshold and exceeds the positive threshold within a time interval not greater than the sensor output signal period for the first time;

(e) determining the coupling factor from the value of the sensor output signal frequency corresponding to the wheel speed when the threshold identification signal is generated; and (f) adjusting the feedback signal magnitude from the initial value to a further value, the further value being determined by the value of the coupling factor.

12. A method of conditioning the output signal of a rotational speed sensor of an automotive vehicle, the frequency of which is analyzed for determining the wheel speed, the amplitude thereof being equally responsive to the wheel speed, by way of a trigger circuit, the hysteresis of which is controllable, by way of:

(1) first circuits for determining a coupling factor which, multiplied by the frequency of the sensor signal corresponding to the rotational speed, controls the amplitude of the sensor output signal, and (2) second circuits for adjusting the hysteresis of the trigger circuit in response to the coupling factor, characterized in that the method further includes determining the coupling factor, by the steps of:

furnishing the first circuits with predetermined amplitude threshold values for the output signal of the rotational speed sensor, which amplitude threshold values define positive or negative deviations of the amplitude of the rotational speed sensor output signal from a predetermined zero point or working point, and determining the coupling factor on start-up of the vehicle from the frequency of the sensor signal representative of the wheel speed at the point of time when both positive and negative amplitude threshold values are reached or exceeded within a period of time not greater than said sensor output signal period for the first time.

* * * * *